(12) United States Patent
Horii et al.

(10) Patent No.: US 7,778,066 B2
(45) Date of Patent: Aug. 17, 2010

(54) RESISTANCE VARIABLE MEMORY DEVICE AND PROGRAMMING METHOD THEREOF

(75) Inventors: Hideki Horii, Seoul (KR); Jun-Soo Bae, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 85 days.

(21) Appl. No.: 12/228,914

(22) Filed: Aug. 18, 2008

(65) Prior Publication Data

US 2009/0052235 A1    Feb. 26, 2009

(30) Foreign Application Priority Data

Aug. 23, 2007  (KR) ................ 10-2007-0085043

(51) Int. Cl.
*G11C 11/00* (2006.01)

(52) U.S. Cl. ............... 365/148; 365/100; 365/189.14; 365/189.16

(58) Field of Classification Search ........... 365/100, 365/148, 189.14, 189.16
See application file for complete search history.

(56) References Cited

U.S. PATENT DOCUMENTS

| | | | |
|---|---|---|---|
| 5,566,111 A | 10/1996 | Choi | |
| 5,999,438 A | 12/1999 | Ohsawa | |
| 6,597,604 B2 | 7/2003 | Yi et al. | |
| 6,625,054 B2 | 9/2003 | Lowrey et al. | |
| 2002/0089877 A1 | 7/2002 | Yi et al. | |
| 2006/0087877 A1* | 4/2006 | Cho et al. | 365/148 |
| 2006/0274574 A1* | 12/2006 | Choi et al. | 365/163 |
| 2007/0236987 A1* | 10/2007 | Cho et al. | 365/163 |

FOREIGN PATENT DOCUMENTS

| | | |
|---|---|---|
| JP | 9-91980 | 4/1997 |
| JP | 10-312691 | 11/1998 |
| JP | 2000-260192 | 9/2000 |
| KR | 2002-0060502 | 7/2002 |

\* cited by examiner

*Primary Examiner*—Thong Q Le
(74) *Attorney, Agent, or Firm*—Mills & Onello, LLP

(57) ABSTRACT

Provided is a method of programming a resistance variable memory device. The resistance variable memory device includes a memory cell having multi states and a write driver outputting a program pulse for programming the memory cell into one of the multi states. The method of programming the resistance variable memory device includes applying a first program pulse to the resistance variable memory device and applying a second program pulse to a memory cell when the memory cell is programmed into an intermediate state. When the first program pulse is a reset pulse, the reset pulse is an over program pulse, that is, an over reset pulse. Therefore, the resistance variable memory device can secure a sufficient read margin as well as improve a resistance drift margin.

20 Claims, 10 Drawing Sheets

Fig. 5

| Write Level | Write Condition | Read Current (Resistance) | Write Pulse Form |
|---|---|---|---|
| (0,0) (Set) | SQ Long(1.5μs) | 60uA (4.5KΩ) | SQ Long / I_SET |
| (0,1) (Intermediate1) | SQ Long(1.5μs) SQ Short(300ns) | 38~52uA (6-8KΩ) | SQ Short / I_SET |
| (1,0) (Intermediate2) | Over PGM(20ns) SQ Short(300ns) | 22~30uA (10~20KΩ) | SQ Short, Over PGM / I_RST |
| (1,1) (Reset) | Over PGM(20ns) | <2uA (500KΩ 이상) | Over PGM / I_RST |

RESISTANCE VARIABLE MEMORY DEVICE AND PROGRAMMING METHOD THEREOF

CROSS-REFERENCE TO RELATED APPLICATIONS

This U.S. non-provisional patent application claims priority under 35 U.S.C. §119 to Korean Patent Application No. 10-2007-0085043, filed on Aug. 23, 2007, the entire contents of which are hereby incorporated by reference.

FIELD OF THE INVENTION

The present invention disclosed herein relates to a semiconductor memory device, and more particularly, to a resistance variable memory device and a programming method thereof.

BACKGROUND OF THE INVENTION

There is an increasing demand for semiconductor memory devices that can offer fast random access and realize large storage capacity and high degree of integration. A representative example of such a semiconductor memory devices is a flash memory commonly used in devices such as portable electronic appliances. Moreover, semiconductor memory devices in which a nonvolatile material is substituted for a capacitor of a dynamic random access memory (DRAM) have been increasingly produced.

Examples of the semiconductor memory devices in which the nonvolatile material is substituted for the capacitor of the DRAM include a ferroelectric RAM (FRAM) using a ferroelectric capacitor, a magnetic RAM (MRAM) using a tunneling magneto-resistive (TMR) layer, a phase change memory device using chalcogenide alloys and the like. Particularly, a resistance variable memory device, such as the phase change memory device, has a relatively simple manufacturing process and can realize a memory of a large amount of capacity at a low cost.

FIG. 1 is a view illustrating a memory cell of a typical resistance variable memory device, in accordance with the prior art. Referring to FIG. 1, a memory cell 10 of a resistance variable memory device includes a variable resistor C and an access transistor M.

The variable resistor C is connected to a bit line BL. The access transistor M is connected between the variable resistor C and a ground. A word line WL is connected to a gate of the access transistor M. When a predetermined voltage is applied to the word line WL, the access transistor M turns on. When the access transistor M turns on, a current $I_c$ is supplied to the variable resistor C through the bit line BL.

The variable resistor C includes a phase change material (not shown). The phase change material has two stabilized states, that is, a crystal state and an amorphous state according to a temperature. The phase change material is changed into the crystal state or the amorphous state according to the current $I_c$ supplied through the bit line BL. A phase change memory device programs data using such properties of the phase change material.

FIG. 2 is a graph illustrating characteristics of a phase change material, in accordance with the prior art. Referring to FIG. 2, reference numeral 1 represents a condition for allowing a phase change material GST to become an amorphous state, and reference numeral 2 represents a condition for a crystal state.

When the phase change material GST is heated at a temperature above a melting temperature $T_m$ for a first duration T1 by supplying a current thereto and is quickly quenched, the phase change material GST changes to the amorphous state. The amorphous state is generally called a reset state and stores data "1". On the other hand, when the phase change material GST is heated at temperature between the melting temperature $T_m$ and a crystallization temperature $T_c$ for a period of time between the first duration T1 and a second duration T2 and is slowly quenched, the phase change material GST changes to the crystal state. The crystal state is generally called a set state and stores data "0". A resistance value of the memory cell is changed according to an amorphous volume of the phase change material GST. The resistance value of the memory cell is the highest in the amorphous state and the lowest in the crystal state.

In recent years, a technology for storing two or more bit data in one memory cell has been developed. This memory cell is called a multi level cell (MLC) and has multi states according to the distribution of resistance. In a resistance variable memory device, the MLC further includes intermediate states between the reset state and the set state. A programming method of a resistance variable memory device having the MLC is disclosed in U.S. Pat. No. 6,625,054 (hereinafter, referred to as '054 patent).

FIGS. 3A-3D are graphs illustrating a programming method of a resistance variable memory device having a typical MLC, where each of FIGS. 3A-3D represents a different set of programming signals, in accordance with the prior art. The programming method as illustrated in FIGS. 3A-3D is disclosed in the '054 patent. Referring to FIGS. 3A-3D, different times T0-T11 are denoted on the TIME axis and currents I0 (min), I1 (max in FIGS. 3A,B,D) and I2 (max in FIG. 3C) are denoted on the CURRENT axis. The memory cell represented in each figure has four states according to a falling time of a program pulse. In case where the memory cell is in a reset state is called a state "11", and in case where the memory cell is in a set state is called a state "00". The memory cell further has a state "10" and a state "01" according to an amorphous volume of a phase change material.

According to the '054 patent, a phase change memory device programs two bits in one memory cell by controlling a falling time of a current pulse supplied into the memory cell. The '054 patent uses a characteristic that the amorphous volume of the phase change material decreases as the falling time of the current pulse increases.

There should be no difference between a resistance value at several nanoseconds after programming and a resistance value at several or several tens of days after programming so that the typical resistance variable memory device, such as the '054 patent, performs a normal MLC operation. However, the resistance value of the resistance variable memory device is changed according to a lapse of time due to the property of the phase change material (GST). This phenomenon is called resistance drift, which can negatively affect the reliability of the device. It would be advantageous to devise a resistance variable memory device that minimizes or substantially eliminates resistance drift.

SUMMARY OF THE INVENTION

In accordance with various aspects of the present invention, there is provided a resistance variable memory device having an improved resistance drift margin. Also, in accordance with aspects of the present invention there is provided a method of programming a resistance variable memory device and a memory system using the same.

In accordance with one aspect of the present invention, provided is a method of programming a resistance variable memory device. The resistance variable memory device includes a memory cell having multi states and a write driver outputting a program pulse for programming the memory cell into one of the multi states. The method of programming includes: applying a first program pulse to the memory cell; and applying a second program pulse to the memory cell when the memory cell is programmed into an intermediate state, wherein, when the first program pulse is a reset pulse, the reset pulse is an over program pulse referred to as an over reset pulse.

When the first program pulse is a set pulse, the set pulse may be a normal program pulse referred to as a normal set pulse.

The second program pulse may be shorter than the normal set pulse in falling time.

The memory cell may have four states "00", "01", "10", and "11", each state having a different resistance value.

The state "00" can have a lowest resistance value, and the method can include transitioning the memory cell to the lowest resistance state "00" when the first program pulse is the normal set pulse.

The state "01" have a second lowest resistance value, and the method can include transitioning the memory cell may to the second lowest resistance state "01" when the second program pulse is shorter than the normal set pulse in falling time.

The state "11" can have a highest resistance value, and the method can include transitioning the memory cell to the highest resistance state "11" when the first program pulse is the over reset pulse.

The state "10" can have a second highest resistance value, and the method can include transitioning the memory cell to the second highest resistance state "10" when the second program pulse is shorter than the normal set pulse in falling time.

The memory cell may include a phase change material.

The method can include heating the phase change material of the memory cell with the normal set pulse having a temperature above a melting temperature and a first falling time above a crystallization time.

The method can include heating the phase change material of the memory cell with the second program pulse having a temperature above the melting temperature and a second falling time shorter than the crystallization time.

The method can include heating may heat the phase change material of the memory cell with the over reset pulse having a temperature above the melting temperature and have a third falling time shorter than the second falling time.

In accordance with another aspect of the present invention, provided is a resistance variable memory devices that includes: a memory cell including multi states; and a write driver configured to output a program pulse for programming the memory cell into one of the multi states, wherein the write driver is configured to apply a first program pulse to the memory cell and applies a second program pulse to the memory cell, and wherein when the memory cell is programmed into an intermediate state among the multi states, and the first program pulse is a set pulse, the set pulse is a normal program pulse referred to as a normal set pulse, and when the first program pulse is a reset pulse, the reset pulse is an over program pulse referred to as an over reset pulse.

The second program pulse may be shorter than the normal set pulse in falling time.

The memory cell can comprise a phase change material.

The normal set pulse can heat the phase change material of the memory cell at a temperature above a melting temperature and have a first falling time above a crystallization time.

The second program pulse can heat the phase change material of the memory cell at a temperature above the melting temperature and have a second falling time shorter than the crystallization time.

The over reset pulse can heat the phase change material of the memory cell at a temperature above the melting temperature and have a third falling time shorter than the second falling time.

In accordance with still another aspect of the present invention, provided is a memory system include a resistance variable memory device; and a memory controller configured to control an operation of the resistance variable memory device, wherein the resistance variable memory device includes a memory cell having multi states and a write driver configured to output a program pulse for programming the memory cell into one of the multi states, wherein the write driver is configured to apply a first program pulse to the memory cell and a second program pulse to the memory cell when the memory cell is programmed into an intermediate state among the multi states, and when the first program pulse is a set pulse, the set pulse is a normal program pulse referred to as a normal set pulse and when the first program pulse is a reset pulse, the reset pulse is an over program pulse referred to as an over reset pulse.

The second program pulse can be shorter than the normal set pulse in falling time.

BRIEF DESCRIPTION OF THE FIGURES

The accompanying figures are incorporated in and constitute a part of this specification. The drawings illustrate exemplary embodiments in accordance with aspects of the present invention and, together with the description, serve to explain principles thereof. In the figures:

FIG. 5 is a chart illustrating examples of a program pulse and a write condition of an embodiment of a write driver illustrated in FIG. 4;

DETAILED DESCRIPTION OF PREFERRED EMBODIMENTS

Figure 1:
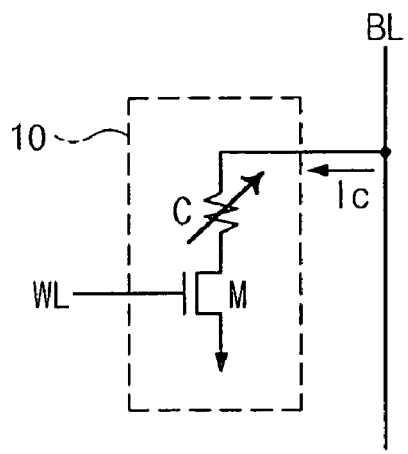
FIG. 1 is a view illustrating a memory cell of a typical resistance variable memory device, in accordance with the prior art.
Figure 2:
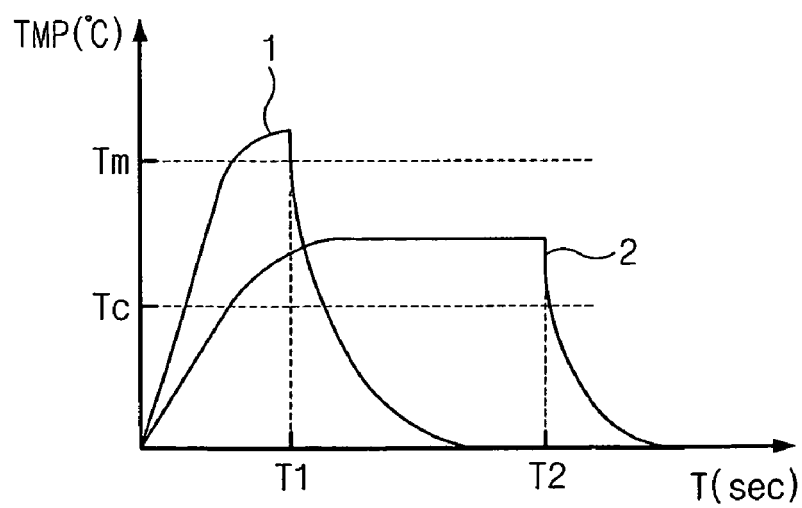
FIG. 2 is a graph illustrating characteristics of a phase change material, in accordance with the prior art.
Figure 3A:
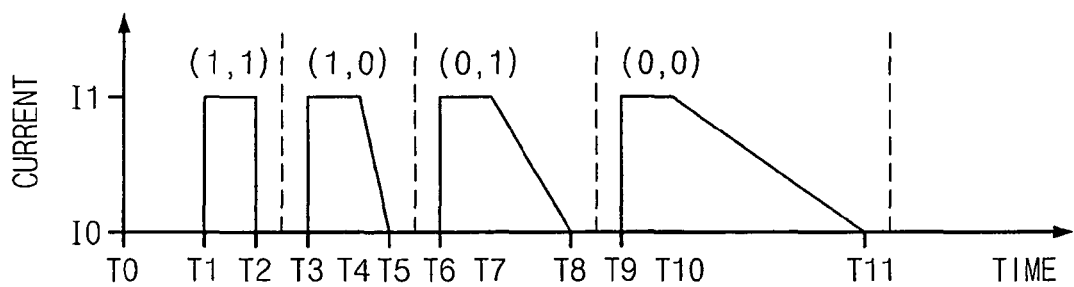
FIGS. 3A-3D are graphs illustrating a programming method of a resistance variable memory device having a typical multi level cell, in accordance with the prior art.
Figure 3B:
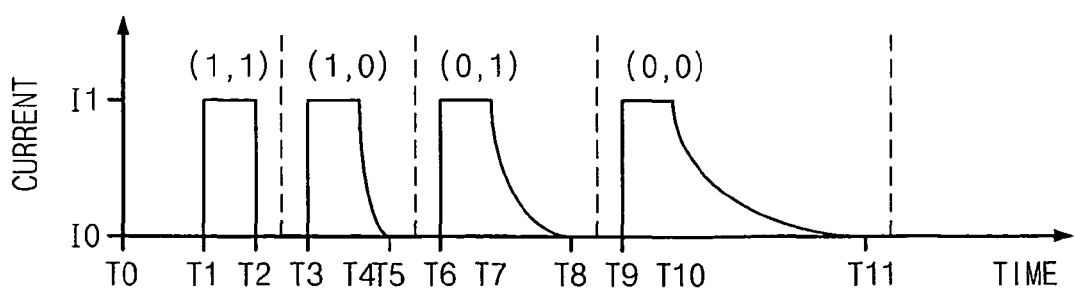
Figure 3C:
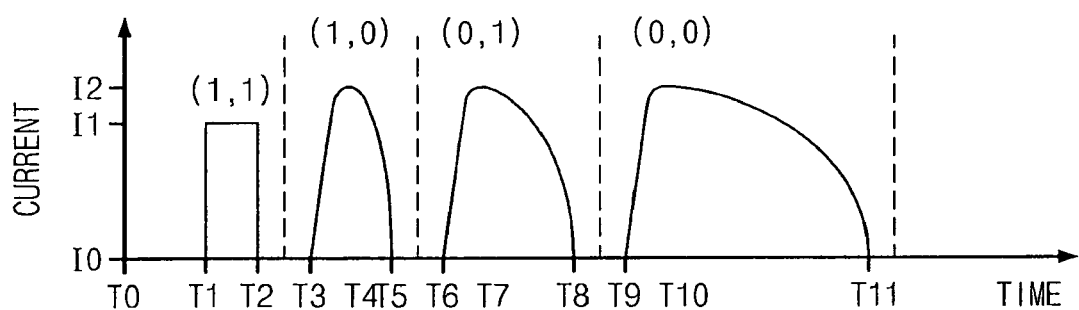
Figure 3D:
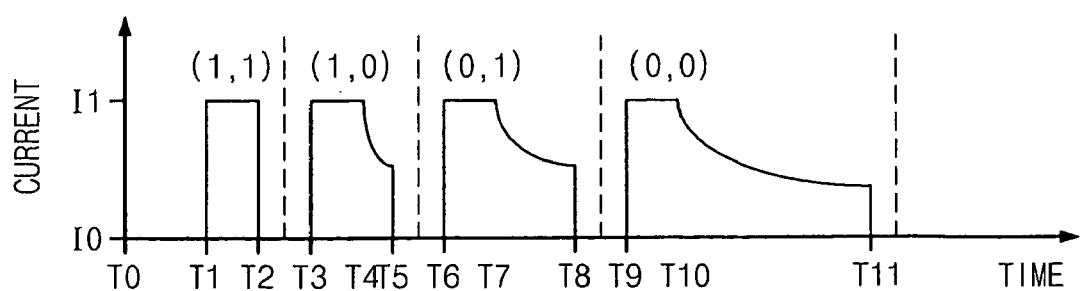

Preferred embodiments in accordance with aspects of the present invention will be described below in more detail with reference to the accompanying drawings. The present invention may, however, be embodied in different forms and should not be constructed as limited to the embodiments set forth herein. Like reference numerals refer to like elements throughout.

Figure 4:
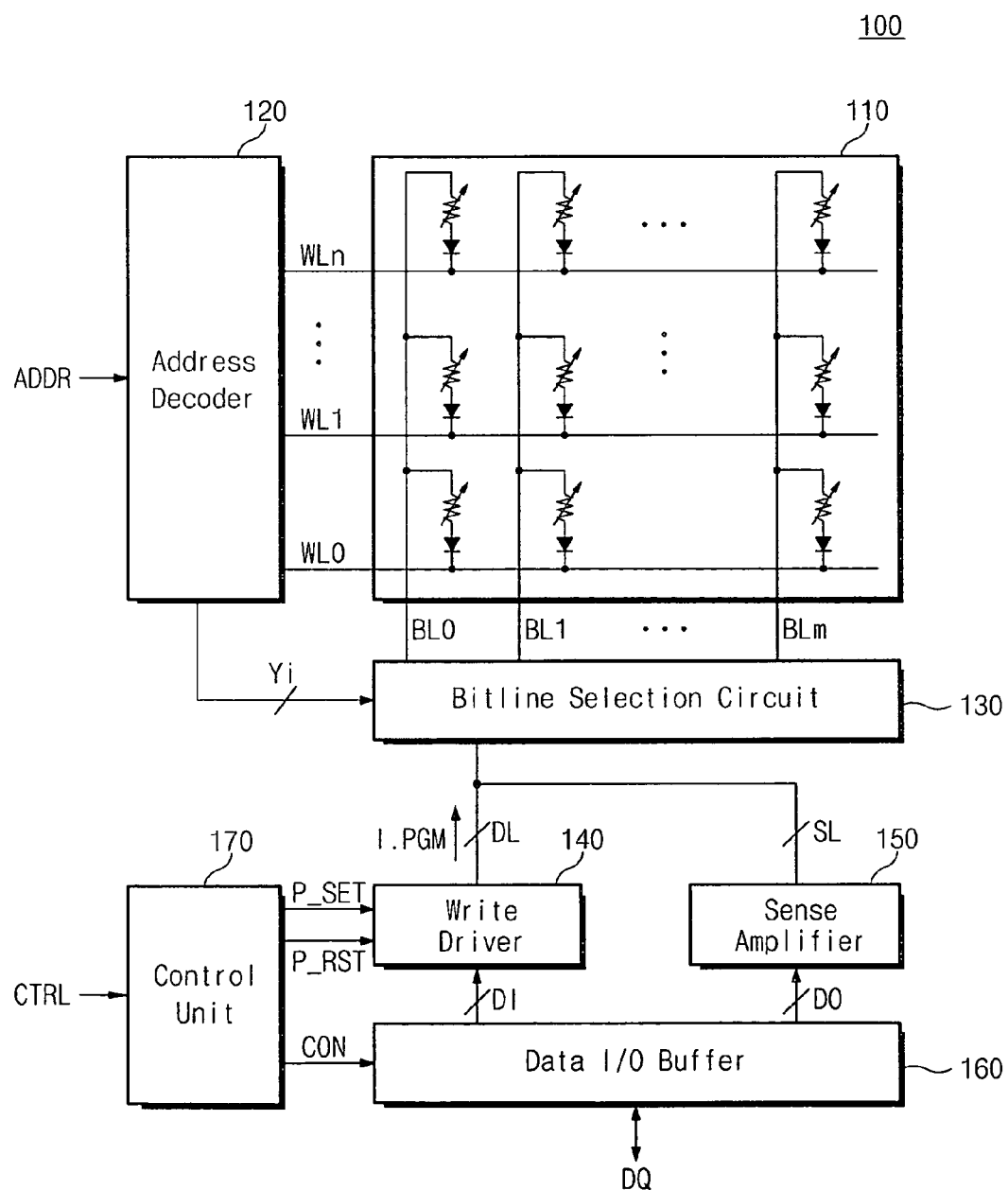
FIG. 4 is a block diagram of an embodiment of a resistance variable memory device according to aspects of the present invention.

FIG. 4 is a block diagram of an embodiment of a resistance variable memory device according to aspects of the present invention. FIG. 4 illustrates a phase change memory device, from among different types of resistance variable memory devices. Referring to FIG. 4, a phase change memory device 100 includes a memory cell array 110, an address decoder 120, a bit line selection circuit 130, a write driver 140, a sense amplifier 150, a data I/O buffer 160, and a control unit 170.

The memory cell array 110 includes a plurality of memory cells. Each of the memory cells includes a variable resistor and a select element, in this embodiment. The variable resistor includes a phase change material GST, and the select element includes a diode D. FIG. 4 illustrates the diode D as the select element, but an NMOS transistor M (see FIG. 1) could be used instead of the diode D, as an example.

A resistance value of the memory cell is changed according to a program state of the phase change material GST. The program state can be one of at least a crystal state exhibiting a low resistance value and an amorphous state exhibiting a high resistance value. The crystal state stores data "0" and is called a set state. The amorphous state stores data "1" and is called a reset state. In this embodiment, a single level cell (SLC) stores the data "0" or the data "1" in one memory cell.

The memory cell can include a plurality of intermediate states between the crystal state and the amorphous state. Thus, a multi level cell (MLC) can be configured to store two or more bit data in one memory cell. The memory cell will be in one of multi states, as determined by an MLC programming operation. For example, if 2-bit data is stored in one memory cell, the memory cell has four states "11", "10", "01", and "00".

A state "11" is the reset state and has the highest resistance value. A state "00" is the set state and has the lowest resistance value. A state "10" and a state "01" are first and second intermediate states and have first and second intermediate resistance values, respectively. The resistance value of the state "10" is higher than that of the state "01".

The address decoder 120 is connected to the memory cell array 110 through word lines WL0 through WLn. The address decoder 120 decodes an address ADDR received form the outside and applies a bias voltage to a selected word line. The address decoder 120 generates a selection signal Yi for selecting bit lines BL0 through BLm. The selection signal Yi is supplied to the bit line selection circuit 130.

The bit line selection circuit 130 is connected to the memory cell array 110 through the bit line BL. The bit line selection circuit 130 selects a bit line in response to the selection signal Yi received from the address decoder 120. The bit line selection circuit 130 includes a plurality of NMOS transistors (not shown), in this embodiment. An NMOS transistor connects a bit line BL to a data line DL during a write operation and connects the bit line BL to a sense line SL during a read operation in response to the selection signal Yi.

The write driver 140 receives pulse control signals P_SET and P_RST and data DATA and applies a program pulse I_PGM to the data line DL. The pulse control signals P_SET and P_RST are received from the control unit 170. The program pulse is used for programming one of the multi states of the memory cell. The write driver 140 applies one or more program pulse I_PGM according to the multi states of the memory cell during the MLC programming operation.

The write driver 140 applies a first program pulse to the memory cell. The write driver 140 applies a second program pulse to the memory cell when the memory cell is programmed into the intermediate states among the multi states of the memory cell. In a case where the first program pulse is a reset pulse, the reset pulse is called an over program pulse (hereinafter, referred to as an "over reset pulse"). In a case where the first program pulse is a set pulse, the set pulse is called a normal program pulse (hereinafter, referred to as a "normal set pulse"). A waveform of the program pulse I_PGM according to the MLC programming operation will be described in detail with reference to FIG. 5.

The sense amplifier 150 senses a differential voltage between the sense line SL and a reference voltage $V_{ref}$ during the read operation to read data stored in a selected memory cell. The reference voltage $V_{ref}$ is applied from a reference voltage generation circuit (not shown). The sense amplifier 150 operates in response to the control signal received from the control unit 170.

The data I/O buffer 160 receives and outputs data from/to an I/O terminal DQ. The number of the I/O terminals DQ depends on the type of resistance variable memory device 100. The data I/O buffer 160 outputs data DI to the write driver 140 in response to a data I/O control signal CON, or outputs data DO read by the sense amplifier 150 to the outside. The data I/O control signal CON is received from the control unit 170.

The control unit 170 outputs the pulse control signals P_SET and P_RST to the write driver 140 in response to an external control signal CTRL and outputs the data I/O control signal CON to the data I/O buffer 160. The control unit 170 controls the pulse control signals P_SET and P_RST during the MCL programming operation so that the memory cell is programmed into a normal program condition or an over program condition.

The resistance variable memory device 100 according to aspects of the present invention solves resistance drift using the over program condition. The resistance drift causes a bad effect during the MLC programming operation. Hereinafter, the over program operation of the memory cell will be described in detail.

FIG. 5 is a chart illustrating examples of a program pulse and a write condition of the write driver illustrated in FIG. 4, according to aspects of the present invention. Referring to FIG. 5, a memory cell has one of four states "00", "01", "10", and "11" according to a program pulse.

A state "00" is a crystal state or a set state. An amorphous volume of the state "00" closes to about zero, and the state "00" has the lowest resistance value (e.g., about 4.5 kΩ). A write driver 140 (see FIG. 4) applies a set pulse I_SET to change a phase change material GST into the set state. The set pulse I_SET has a first falling time (e.g., about 1.5 μs). The first falling time is relatively long. The first falling time is represented as a "SQ long" in FIG. 5.

When the set pulse I_SET having the first falling time is applied, the memory cell is programmed into the state "00"

and has a resistance value of about 4.5 kΩ, in the present embodiment. The memory cell of the state "00" has a read current of about 60 μA, also in this embodiment.

A state "01" is a first intermediate state. The memory cell of the state "01" is greater than that of the state "00" in amorphous volume and has a resistance value ranging from about 6 kΩ to about 8 kΩ, in this embodiment. A write driver 140 applies a first intermediate pulse after applying the set pulse I_SET to change the phase change material GST into the first intermediate state. The first intermediate pulse has a second falling time (e.g., about 300 ns). The second falling time (e.g., about 300 ns) is shorter than the first falling time (e.g., about 1.5 μs). The second falling time is represented as a "SQ short" in FIG. 5.

When the set pulse I_SET having the first falling time and the intermediate pulse having the second falling time are applied, the memory cell is programmed into the state "01" and has a resistance value ranging from about 6 kΩ to about 8 kΩ. The memory cell of the stat "01" has a read current ranging from about 38 μA to about 52 μA, in this embodiment.

A state "11" is an amorphous stat or a reset state. The amorphous volume of the state "00" is the greatest, and the memory cell of the state "11" has the highest resistance value (e.g., about 500 kΩ). The write driver 140 applies a reset pulse I_RST to change the phase change material GST into the reset state. The reset pulse I_RST has a third falling time (e.g., about 20 ns or less). The third falling time is much shorter than the second falling time.

Figure 6:
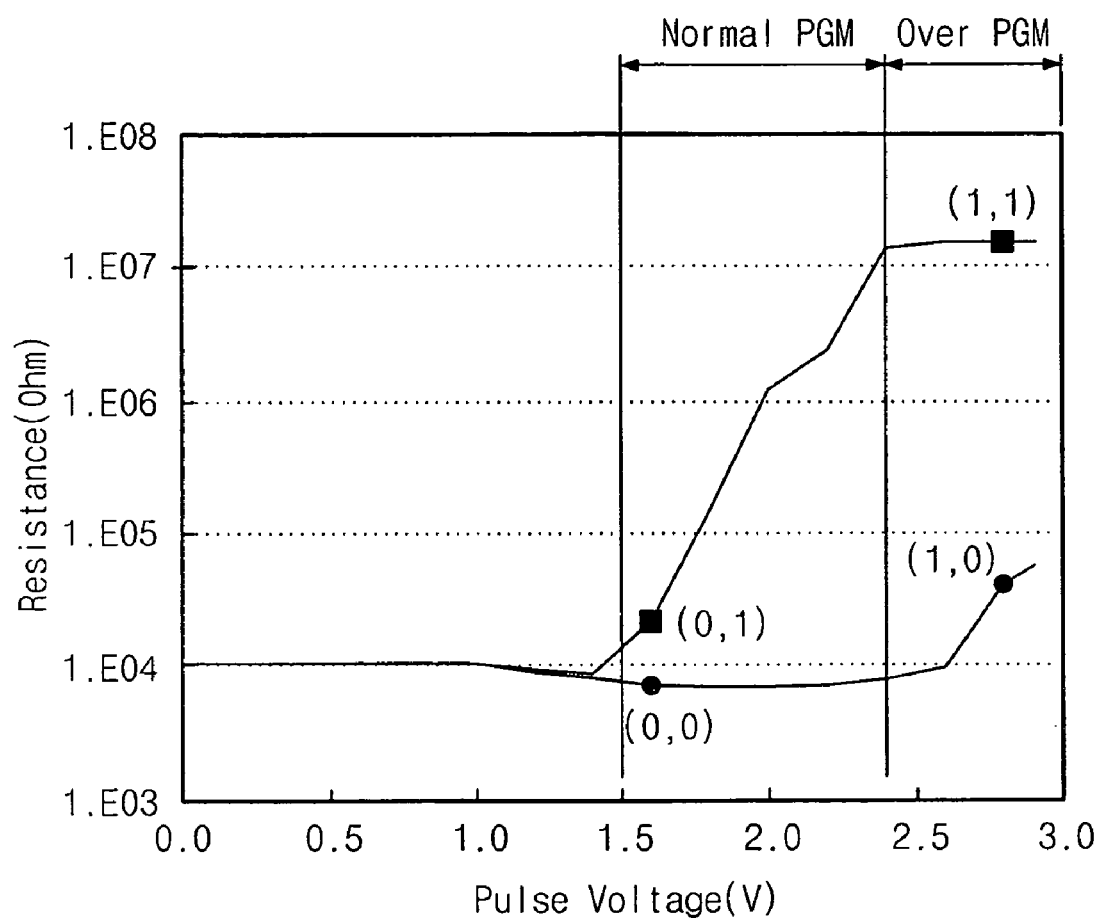
FIG. 6 is a graph illustrating a normal program condition and an over program condition, in accordance with the present invention.

The reset pulse I_RST occurs in an over program condition. Hereinafter, the reset pulse I_RST of the over program condition will be simply referred to as an over reset pulse. FIG. 6 is a graph illustrating a normal program condition and an over program condition, in accordance with the present invention. A normal program condition is a program condition that is being commonly used. Referring to FIG. 6, a normal pulse voltage ranges from about 1.5 V to about 2.5 V, in this embodiment. An over program condition is a program condition that applies a voltage of the normal program voltage or more. An over pulse voltage is about 2.5 V or more.

When an over reset pulse I_RST having a third falling time (e.g., about 20 ns or less) is applied, a memory cell is programmed into a state "11" and has a resistance value of about 500 kΩ or more, in this embodiment. And the memory cell of the state "11" has a resistance value of about 10 MΩ in the over program condition. In this embodiment, the memory cell of the state "11" has a read current of about 2 μA or less.

A state "10" is a second intermediate state. An amorphous volume of the memory cell of the state "10" is greater than that of a state "01", and the memory cell of the state "10" has a resistance value ranging from about 10 kΩ to about 20 kΩ, in this embodiment. A write driver 140 applies a second intermediate pulse after applying the over reset pulse I_RST to change a phase change material GST into the second intermediate state. The second intermediate pulse has a falling time nearly similar to a second falling time (e.g., about 300 ns). Hereinafter, it will be assumed that the second intermediate pulse has the second falling time.

When the second intermediate pulse having the over reset pulse I_RST and the second falling time is applied, the memory cell is programmed into the state "10" and has a resistance value ranging from about 10 kΩ to about 20 kΩ. The memory cell of the state "10" has a read current ranging from about 22 μA to about 30 μA.

When a normal set pulse I_SET having the normal pulse voltage ranging from about 1.5 V to about 2.5 V is applied, the memory cell is programmed into a state "00". When a first intermediate pulse having a falling time of about 300 ns is additionally applied to the memory cell of the state "00", the memory cell is programmed into the state "01". When the over reset pulse I_RST having the over pulse voltage of about 2.5 V or more is applied, the memory cell is programmed into the state "11". And when the second intermediate pulse having the falling time of about 300 ns is applied to the memory cell of the state "11", the memory cell is programmed into the state "10".

Figure 7:
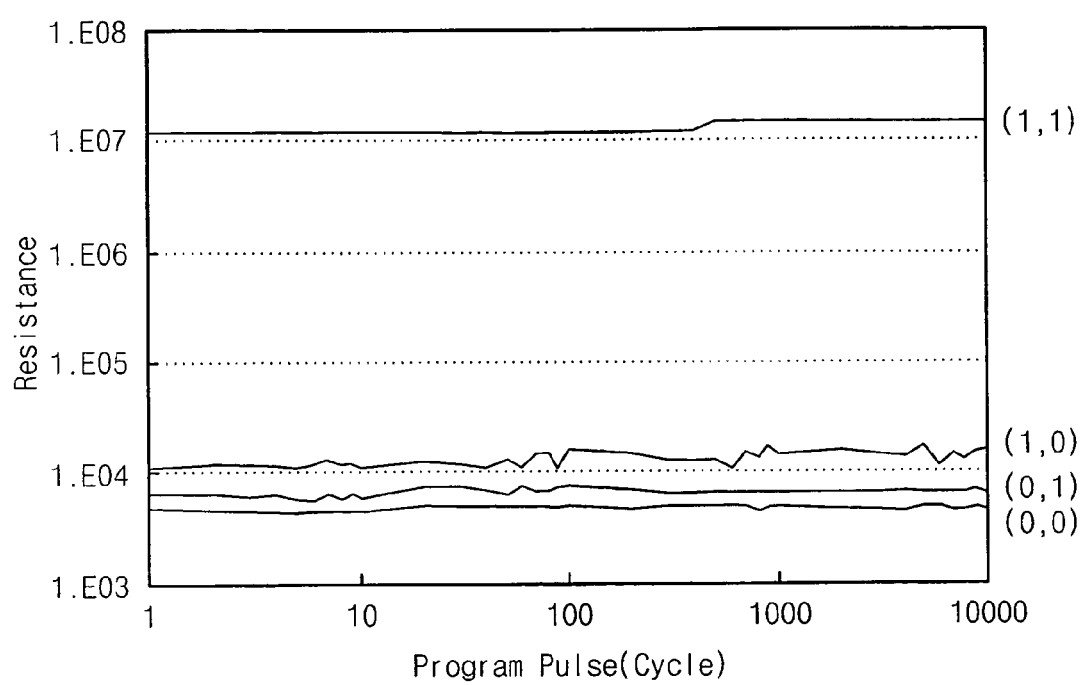
FIG. 7 is a graph illustrating results of measuring a resistance change according to a program pulse count, in accordance with the present invention.

FIG. 7 is a graph illustrating results of measuring a resistance change according to a program pulse count, in accordance with the present invention. Referring to FIG. 7, it can be verified that a significant resistance drift does not occur—even if a program pulse count increases. Particularly, when the intermediate pulse having a short falling time is applied after applying the over reset pulse I_RST, the memory cell of the state "10" has a more stable resistance distribution.

Figure 8:
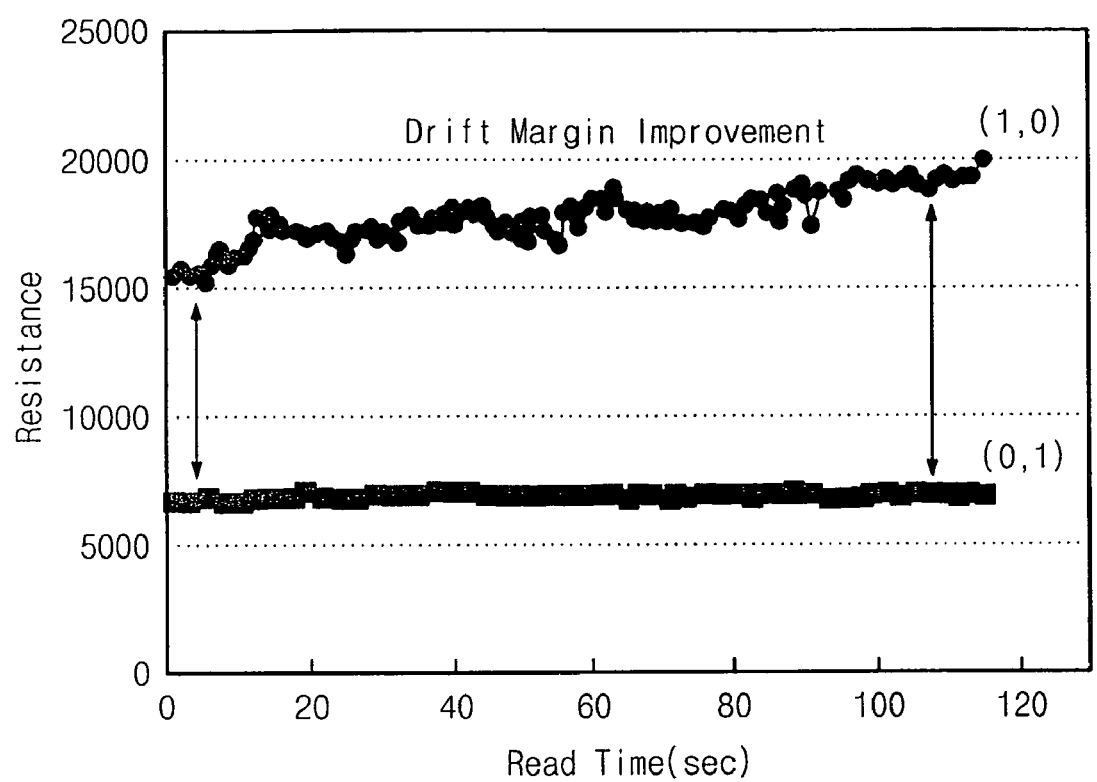
FIG. 8 is a graph illustrating results of measuring a resistance change of a memory cell of a state "01" and a state "10" according to a read time, in accordance with the present invention.

FIG. 8 is a graph illustrating results of measuring a resistance change of a memory cell of a state "01" and a state "10" according to a read time, in accordance with the present invention. Referring to FIG. 8, when a read time increases, it can be verified that a memory cell of a state "01" has a more stable drift margin.

The following Equation 1 indicates a resistance change according to a time variation.

$$R = RO \times t^d \qquad \text{[Equation 1]}$$

where "R" denotes a phase change material. "RO" denotes an initial resistance value, i.e., a resistance value at about one second later after a write operation. A character "t" denotes a time, and "d" denotes a drift coefficient.

A resistance change of the phase change material programmed into four states "00", "01", "10", and "11" is obtained from measurement results and can be expressed according to the following Equation 2.

$$R = 4500 \times t^{0.006} \qquad \text{[Equation 2]}$$

The resistance change in a state "00" is expressed as Equation 2. The initial resistance value is about 4500Ω. The drift coefficient d is smaller than about 0.01, in this case about 0.006. The resistance change in the state "00" is small.

$$R = 6600 \times t^{0.0079} \qquad \text{[Equation 3]}$$

The resistance change in a state "01" is expressed as Equation 3. The initial resistance value is about 6600Ω. The drift coefficient d is smaller than about 0.01, in this case about 0.0079. The resistance change in the state "01" is small.

$$R = 14400 \times t^{0.0542} \qquad \text{[Equation 4]}$$

The resistance change in a state "10" is expressed as Equation 4. The initial resistance value is about 14400Ω. The drift coefficient d is larger than about 0.01 and smaller than 0.06, in this case about 0.0542. Therefore, the drift margins increases from the "01" state to the "10" state.

$$R = 120000 \times t^{0.090} \qquad \text{[Equation 5]}$$

The resistance change in a state "11" is expressed as Equation 5. The initial resistance value is about 120000Ω. The drift coefficient d is larger than about 0.06, in this case about 0.090. The drift margin in the state "11" and the state "10" increased in both cases.

In a typical programming method, it is difficult to reduce the drift coefficient d to about 0.06 or less. However, according to present invention, since the drift coefficients d in the states "00", "01", and "10" are about 0.06 or less, data errors due to the resistance drift can be prevented. In the typical programming method, since the initial resistance value in only the state "00" is about 10 kΩ or less, the drift coefficient in the state "00" is about 0.06 or less. On the other hand, since the initial resistance values in the states "01", "10", and "11" are about 10 kΩ or more, the drift coefficients in the states "01", "10", and "11" is relatively high. Therefore, the drift margin does not exist.

Figure 9:
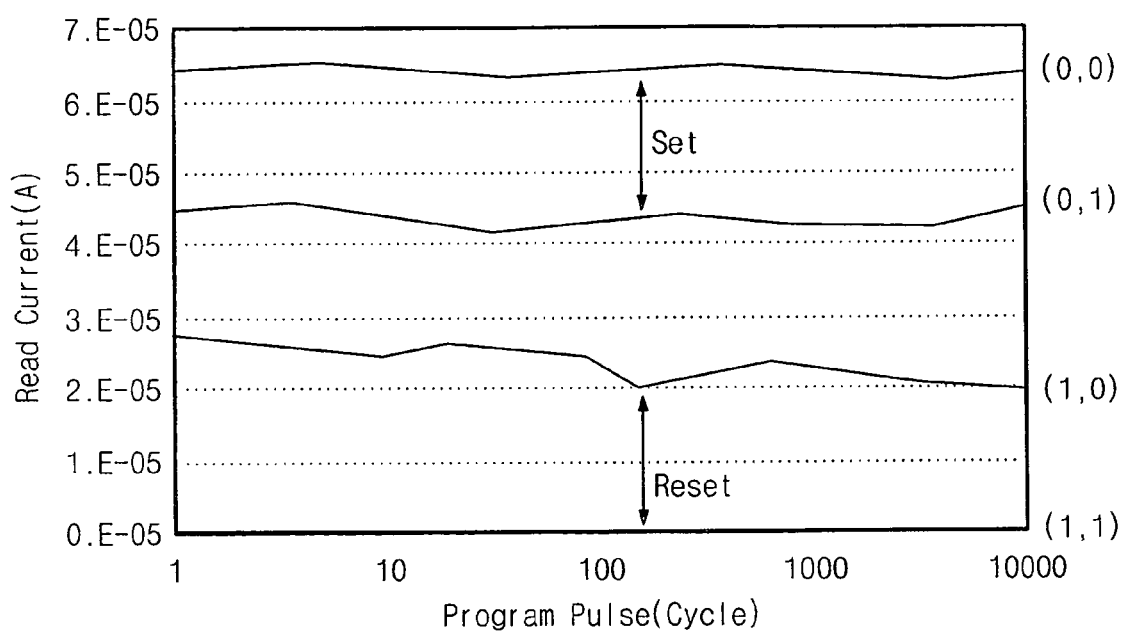
FIG. 9 is a graph illustrating a read current change according to a program pulse count, in accordance with the present invention.

FIG. 9 is a graph illustrating a read current change according to a program pulse count, in accordance with the present invention. Referring to FIG. 9, when a program pulse count increases, a memory cell of a state "00" has a read current of about 63 μA. The memory cell of a state "01" has the read current ranging from about 42 μA to about 46 μA. The memory cell of a state "11" has the read current of about 2 μA, and the memory cell of a state "10" has the read current ranging from about 20 μA to about 28 μA. According to the present invention, a read current margin is sufficiently secured in each of states during a MLC programming operation.

Figure 10:
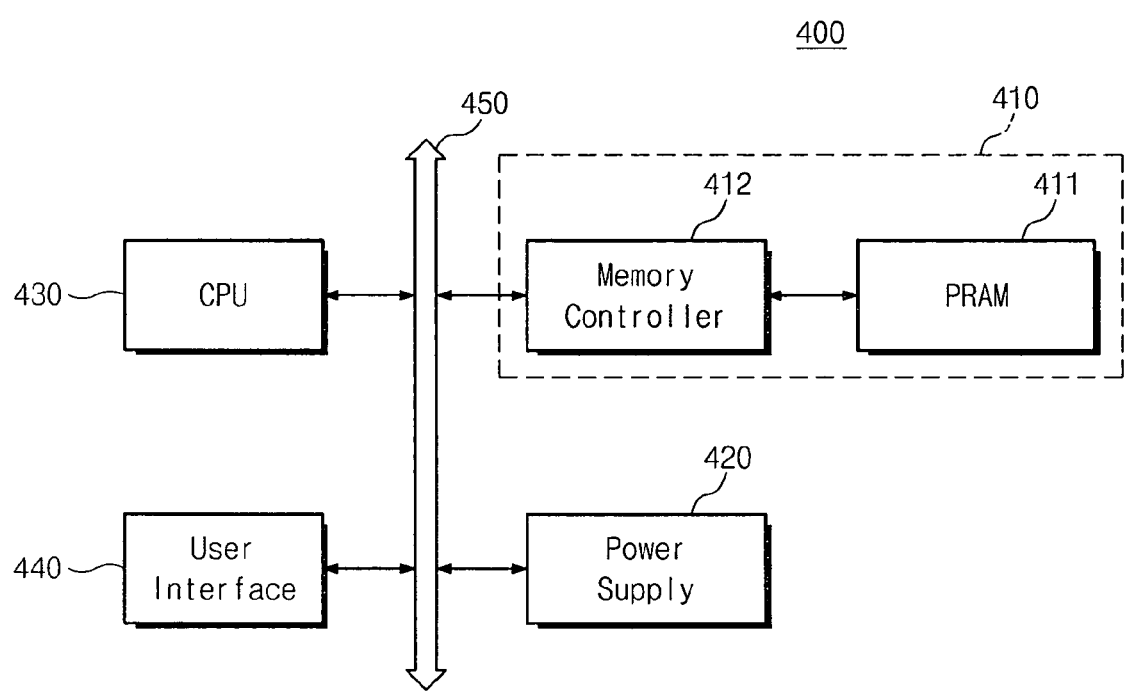
FIG. 10 is a block diagram of an embodiment of a computing system including a resistance variable memory device according to aspects of the present invention.

FIG. 10 is a block diagram of an embodiment of a computing system 400 including a resistance variable memory device according to aspects of the present invention. Referring to FIG. 10, the computing system 400 includes a flash memory system 410, a central processing unit (CPU) 430, a user interface 440, and a power supply 420. The flash memory system 410 includes a resistance variable change memory device 411 and a memory controller 412. The CPU is electrically connected to a system bus 450.

The resistance variable change memory device 411 stores data through the memory controller 412. The data is received from the user interface 440 or processed by the CPU. The memory system may be used as a semiconductor disc device SSD, as an example. In a case, a booting speed of the computing system 400 remarkably increases.

Although not shown, those having ordinary skill in the art would appreciate that the computing system 400 according to the present invention could further include an application chipset, a camera image processor CIS, and a mobile DRAM, as examples.

The above-disclosed subject matter is to be considered illustrative, and not restrictive, and various modifications, enhancements, and other embodiments can be made, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of programming a resistance variable memory device having a memory cell having multi states and a write driver outputting program pulses for programming the memory cell into one of the multi states, the method of programming comprising:

applying a first program pulse to the memory cell; and
applying a second program pulse to the memory cell when the memory cell is programmed into an intermediate state,
wherein, when the first program pulse is a reset pulse, the reset pulse is an over program pulse referred to as an over reset pulse.

2. The programming method of claim 1, wherein, when the first program pulse is a set pulse, the set pulse is a normal program pulse referred to as a normal set pulse.

3. The programming method of claim 2, wherein the second program pulse is shorter than the normal set pulse in falling time.

4. The programming method of claim 2, wherein the multi states of the memory cell include four states "00", "01", "10", and "11", each of the four states having a different resistance value.

5. The programming method of claim 4, wherein the state "00" has a lowest resistance value, the method including transitioning the memory cell to the lowest resistance state "00" when the first program pulse is the normal set pulse.

6. The programming method of claim 5, wherein the state "01" has a second lowest resistance value, the method including transitioning the memory cell to the second lowest resistance state "01" when the second program pulse is shorter than the normal set pulse in falling time.

7. The programming method of claim 5, wherein the state "11" has a highest resistance value, the method including transitioning the memory cell to the highest resistance state "11" when the first program pulse is the over reset pulse.

8. The programming method of claim 7, wherein the state "10" has a second highest resistance value, the method including transitioning the memory cell to the second highest resistance state "10" when the second program pulse is shorter than the normal set pulse in falling time.

9. The programming method of claim 2, wherein the memory cell comprises a phase change material.

10. The programming method of claim 9, including heating the phase change material of the memory cell with a normal set pulse having a temperature above a melting temperature and a first falling time above a crystallization time.

11. The programming method of claim 10, including heating the phase change material of the memory cell with the second program pulse having a temperature above the melting temperature and a second falling time shorter than the crystallization time.

12. The programming method of claim 11, including heating the phase change material of the memory cell with the over reset pulse at a temperature above the melting temperature and a third falling time shorter than the second falling time.

13. A resistance variable memory device, comprising:
a memory cell having multi states; and
a write driver configured to output a program pulse for programming the memory cell into one of the multi states, wherein the write driver is configured to apply a first program pulse to the memory cell and apply a second program pulse to the memory cell when the memory cell is programmed into an intermediate state among the multi states, wherein:
when the first program pulse is a set pulse, the set pulse is a normal program pulse referred to as a normal set pulse, and
when the first program pulse is a reset pulse, the reset pulse is an over program pulse referred to as an over reset pulse.

14. The resistance variable memory device of claim 13, wherein the second program pulse is shorter than the normal set pulse in falling time.

15. The resistance variable memory device of claim 13, wherein the memory cell comprises a phase change material.

16. The resistance variable memory device of claim 15, wherein the normal set pulse heats the phase change material of the memory cell at a temperature above a melting temperature and has a first falling time above a crystallization time.

17. The resistance variable memory device of claim 16, wherein the second program pulse heats the phase change material of the memory cell at a temperature above the melting temperature and has a second falling time shorter than the crystallization time.

18. The resistance variable memory device of claim 17, wherein the over reset pulse heats the phase change material of the memory cell at a temperature above the melting temperature and has a third falling time shorter than the second falling time.

19. A memory system, comprising:
- a resistance variable memory device; and
- a memory controller configured to control an operation of the resistance variable memory device,
- wherein the resistance variable memory device includes a memory cell having multi states and a write driver configured to output a program pulse for programming the memory cell into one of the multi states, and
- the write driver is configured to apply a first program pulse to the memory cell and apply a second program pulse to the memory cell when the memory cell is programmed into an intermediate state among the multi states, and when the first program pulse is a set pulse, the set pulse is a normal program pulse referred to as a normal set pulse, and when the first program pulse is a reset pulse, the reset pulse is an over program pulse referred to as an over reset pulse.

20. The memory system of claim 19, wherein the second program pulse is shorter than the normal set pulse in falling time.

* * * * *